(12) United States Patent
Franchitti

(10) Patent No.: US 12,000,886 B2
(45) Date of Patent: Jun. 4, 2024

(54) SELF-TEST CIRCUIT AND A METHOD OF CHECKING THE INTEGRITY OF A SIGNAL THROUGH A SIGNAL PATH

(71) Applicant: Aktiebolaget SKF, Gothenburg (SE)

(72) Inventor: Julian Franchitti, Biggar (GB)

(73) Assignee: AKTIEBOLAGET SKF, Gothenburg (SE)

( * ) Notice: Subject to any disclaimer, the term of this patent is extended or adjusted under 35 U.S.C. 154(b) by 1212 days.

(21) Appl. No.: 15/830,046

(22) Filed: Dec. 4, 2017

(65) Prior Publication Data

US 2019/0170813 A1 Jun. 6, 2019

(51) Int. Cl.
*G01R 31/28* (2006.01)
*G01R 29/22* (2006.01)
*H01L 21/66* (2006.01)

(52) U.S. Cl.
CPC ......... *G01R 31/2884* (2013.01); *G01R 29/22* (2013.01); *H01L 22/34* (2013.01)

(58) Field of Classification Search
CPC ......... H02J 1/00; H01L 21/00; H01L 2221/00
See application file for complete search history.

(56) References Cited

U.S. PATENT DOCUMENTS

| | | | | |
|---|---|---|---|---|
| 2,677,804 A * | 5/1954 | Foster | ..................... | G01R 23/00 324/76.39 |
| 3,786,348 A * | 1/1974 | Lynas | ..................... | G01P 15/09 324/727 |
| 4,142,147 A * | 2/1979 | Stein | ..................... | G04D 7/1214 324/76.47 |
| 5,166,910 A * | 11/1992 | Batzle | ..................... | G01N 29/07 367/191 |
| 5,373,722 A * | 12/1994 | Spies | ..................... | B60R 21/0132 73/1.39 |
| 5,447,051 A * | 9/1995 | Hanks | ..................... | G01P 15/0922 73/1.15 |
| 5,492,014 A * | 2/1996 | Hazony | ..................... | G01H 11/08 73/629 |
| 5,605,461 A * | 2/1997 | Seeton | ..................... | F41A 33/02 12/103 |
| 6,067,859 A * | 5/2000 | Kas | ..................... | G21K 1/006 250/251 |
| 6,292,002 B1 * | 9/2001 | Pringle, Jr. | ........ | G01R 31/2824 324/633 |

(Continued)

FOREIGN PATENT DOCUMENTS

RU 2014130117 A 2/2016

OTHER PUBLICATIONS

Preliminary Search Report and Written Opinion from the French Patent Office mailed May 15, 2020 in related application FR 1860365, and translation thereof.

*Primary Examiner* — Jermele M Hollington
*Assistant Examiner* — Temilade S Rhodes-Vivour
(74) *Attorney, Agent, or Firm* — J-TEK LAW PLLC; Scott T. Wakeman; Mark A. Ussai (57) ABSTRACT

Examples provide for a self-test circuit. The self-test circuit comprises input circuitry; testing circuitry; and a circuit to be tested, coupled between the input and testing circuitry and comprising at least a piezoelectric crystal. The input circuitry is configured to generate and transfer a predefined electric signal comprising at least a sinusoidal signal through at least the piezoelectric crystal of the circuit to be tested to generate an output signal. The testing circuitry is configured to analyze the output signal.

11 Claims, 4 Drawing Sheets

(56) References Cited

U.S. PATENT DOCUMENTS

| | | | | |
|---|---|---|---|---|
| 2003/0024298 | A1* | 2/2003 | Baber | G01D 3/08 |
| | | | | 73/1.82 |
| 2004/0194532 | A1* | 10/2004 | Lally | G01D 3/08 |
| | | | | 73/1.82 |
| 2005/0225201 | A1* | 10/2005 | Vogeley | H10N 30/802 |
| | | | | 310/317 |
| 2007/0272393 | A1* | 11/2007 | Reichenbach | G05D 23/1917 |
| | | | | 165/84 |
| 2007/0285170 | A1* | 12/2007 | Mujtaba | H03G 1/0088 |
| | | | | 330/285 |
| 2009/0114727 | A1* | 5/2009 | Heinrich | G06K 7/10584 |
| | | | | 235/462.25 |
| 2010/0293426 | A1* | 11/2010 | Dasnurkar | G01R 31/31709 |
| | | | | 714/733 |
| 2010/0305886 | A1* | 12/2010 | Zhuge | G05B 19/19 |
| | | | | 702/56 |
| 2011/0050214 | A1* | 3/2011 | Bahreyni | G01R 33/0283 |
| | | | | 324/244 |
| 2012/0262812 | A1* | 10/2012 | McGuire | G11B 5/4555 |
| | | | | 360/31 |
| 2013/0166227 | A1* | 6/2013 | Hermann | G01N 29/30 |
| | | | | 702/51 |
| 2013/0201046 | A1* | 8/2013 | Mir | H03M 3/378 |
| | | | | 341/143 |
| 2014/0067289 | A1* | 3/2014 | Baldwin | G01N 29/449 |
| | | | | 702/56 |
| 2014/0320154 | A1 | 10/2014 | Arunachalam et al. | |
| 2016/0157017 | A1* | 6/2016 | Lesso | G01P 15/125 |
| | | | | 381/71.7 |
| 2018/0152254 | A1* | 5/2018 | Vaucher | H03G 3/3078 |

* cited by examiner

SELF-TEST CIRCUIT AND A METHOD OF CHECKING THE INTEGRITY OF A SIGNAL THROUGH A SIGNAL PATH

TECHNOLOGICAL FIELD

Examples relate to a self-test circuit and method for same, and, in particular, to a self-test circuit and method of checking the integrity of a signal through a signal path containing a piezoelectric crystal.

BACKGROUND

Vibration crystals are often used to detect the condition of bearings in operation. These piezoelectric crystals may be secured to a bearing, a bearing housing, or an associated machine. These bearings are often in tight, hard-to-reach locations, with moving parts and limited (if any) access, particularly while the machine or device is operating. These factors make it difficult and burdensome to perform manual inspections or repairs. In order to perform such inspections, the machine (such as a railcar) would need to be removed from service in order to be accessed. If a fault develops in the field, it may go unnoticed until the next inspection.

A built-in self-test can be used to test proper functioning of circuit components. With respect to circuits containing piezoelectric crystals, in order to ensure that the crystals are properly secured in position, an external signal can be applied using a separate sensor or secondary piezoelectric crystal with a signal generator. An alternative method to determine if the crystal is properly secured in position would be to excite the housing it is attached to. These solutions require the use of additional components, additional set up equipment, and extra time. Some self-tests have been proposed that allow for testing the piezoelectric crystal without the need for a second crystal, but these methods only test the proper installation of the crystal itself; they do not provide any information about the proper functioning of the other stages of the circuit besides the piezoelectric crystal.

Therefore, there is a need for a self-test circuit and method for testing the integrity of a signal through a signal path containing a piezoelectric crystal.

SUMMARY

Examples relate to a self-test circuit and method for same, and, in particular, to a self-test circuit and method of checking the integrity of a signal through a signal path containing a piezoelectric crystal. Examples of the present disclosure can be used for self-testing condition monitoring sensor circuitry, such as monitoring sensor circuitry for bearings, for example.

Examples provide for a self-test circuit. The self-test circuit comprises input circuitry; testing circuitry; and a circuit to be tested, coupled between the input and testing circuitry and comprising at least a piezoelectric crystal. The input circuitry is configured to generate and transfer a predefined electric signal comprising at least a sinusoidal signal through at least the piezoelectric crystal of the circuit to be tested to generate an output signal. The testing circuitry is configured to analyze the output signal.

In some examples, the self-test circuit may further comprise at least one of a low-pass, bandpass, and a high-pass filter circuit. The input circuitry may be configured to transfer the predefined electric signal through the piezoelectric crystal and the at least one of the low-pass, the bandpass, and the high-pass filter circuit of the circuit to be tested to generate an output signal.

In some examples, the self-test circuit may be configured to perform signal amplitude or frequency assessments on the output signal.

In some examples, the testing circuitry may comprise a signal processor configured to con-vert the output signal from time domain to frequency domain and to analyze the output signal in the frequency domain.

In some examples, the input circuitry may be configured to generate the at least one sinusoidal signal with a frequency greater than 0 Hz and less than the resonant frequency of the piezoelectric crystal.

In some examples, the input circuitry may comprise a digital signal processor configured to generate a predefined digital signal and to convert the digital signal to the analog domain to generate the predefined electric signal.

In some examples, the self-test circuit may comprise a switch configured to select between normal operation and test mode. When in test mode, the switch may connect the input circuitry to the circuit to be tested. The switch may remain in test mode at least until the output signal is generated.

Examples provide for a method of self-testing a circuit. The method comprises generating a predefined electric signal; transferring the predefined electric signal comprising at least a sinusoidal signal through at least a piezoelectric crystal of a circuit to be tested to generate an output signal; and analyzing the output signal.

In some examples, the method may further comprise transferring the predefined electric signal through the piezoelectric crystal and at least one of a low-pass, bandpass, and high-pass filter circuit of the circuit to be tested to generate an output signal.

In some examples, analyzing the output signal may comprise performing signal amplitude or frequency assessments on the output signal.

BRIEF DESCRIPTION OF THE DRAWINGS

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
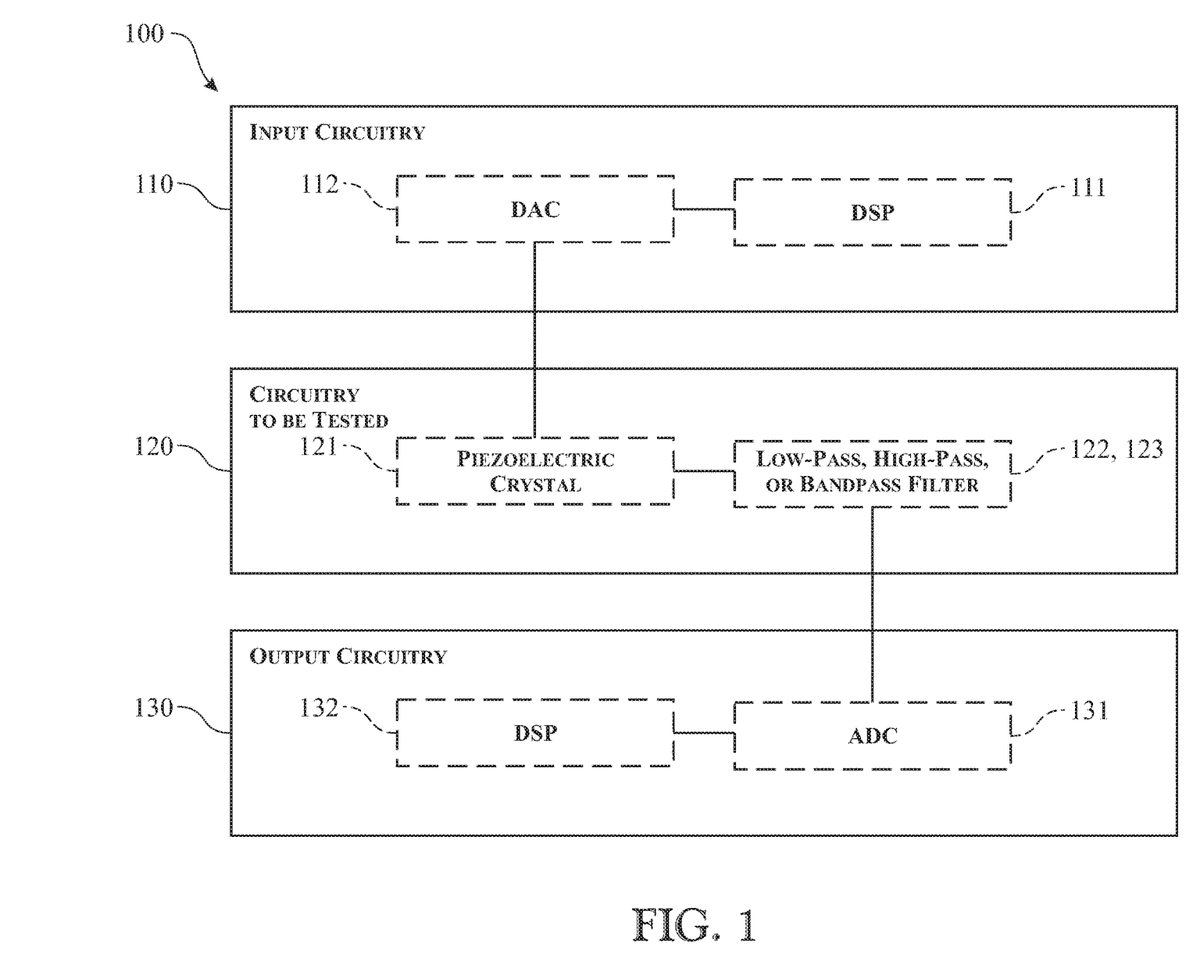
FIG. 1 shows a block diagram of a self-test circuit.

FIG. 1 shows a block diagram of a self-test circuit 100. The self-test circuit 100 comprises input circuitry 110, a circuit to be tested 120, comprising at least a piezoelectric crystal 121, and output circuitry 130. The piezoelectric crystal 121 may be attached to a bearing, a housing, or an associated machine as vibration sensing means, for example.

The input circuitry 110 is configured to generate an electrical source signal which may have a single predetermined frequency and amplitude. The electrical source signal should contain AC characteristics. A sinusoidal wave of predetermined frequency and amplitude is preferred, although a combined (superimposed) electrical source signal containing a finite number of multiple frequencies may also be used (such as a complex wave). While the electrical source signal may have a single fixed frequency in some embodiments, the frequency of the electrical source signal may also be varied (e.g., swept from a lower frequency to an upper frequency) in other embodiments. Similar considerations may be given for the amplitude. The electrical source signal may comprise a frequency greater than 0 Hz but less than the resonant frequency of the piezoelectric crystal. The electrical source signal may be a voltage signal. For example, a sinusoidal voltage signal of 10 Hz with a fixed amplitude could be generated.

It should be appreciated that the characteristics (i.e. frequency and/or amplitude) of the pro-vided electrical signal may be adjusted as needed to test certain components. For example, a square wave form pulse would be insufficient because it can only show whether or not the components are connected, but it would lack the characteristic features necessary to deter-mine whether a given component is functioning properly (such as a low-pass filter). In order to test a low-pass filter component, frequencies above the filter range would have to be provided, and the output signal tested to see if these frequencies were in fact filtered or not. Similar considerations must be taken for other circuit components to be tested.

The input circuitry 110 may comprise a digital signal processor (DSP) 111 coupled to a digital to analog converter (DAC) 112. The DSP 111 may generate a digital sinusoidal wave which is then converted to the analog domain by the DAC 112 before being passed through the circuit to be tested 120. Although a DSP and DAC are used in the example shown in FIG. 1, any input circuitry 110 configured to generate a sinusoidal wave of known frequency and amplitude with AC characteristics may be used.

The circuit to be tested 120 comprises at least a piezoelectric crystal 121 and one or more other circuit stages 122. Rather than apply a mechanical force as is traditionally done in the use of piezoelectric crystals, an electrical AC signal in the form of a sine wave is injected through the piezoelectric crystal 121 of a known capacitance. Due to its capacitive characteristic, the piezoelectric crystal 121 will let the electrical AC signal pass through. After passing through the piezoelectric crystal 121, the sine wave then passes through other circuit stages 122.

The circuit to be tested 120 may contain other circuit stages 122 further comprising a low-pass, bandpass, or high-pass filter circuit (collectively shown as 123 in FIG. 1). Other circuit stages 122 may also comprise passive circuit components (for example capacitors, resistors) or active circuit components (for example, amplifiers, transistors). The circuit to be tested 120 is coupled between the input circuitry 110 and the output circuitry 130.

The output circuitry 130 is configured to receive the sine wave after it has passed through the piezoelectric crystal 121 and other circuit stages 122. Since the characteristics of the components of the circuit to be tested 120 and the electrical signal are known, it is possible to determine the effect they will have on the electrical source signal under normal operation. Thus, it is possible to compare the electrical signal received at the output circuitry 130 with an expected output signal in order to determine a variety of parameters. For example:

1—That the piezoelectric crystal 121 is electrically attached to the printed circuit board (PCB) and capable of functioning;
2—Gain of the circuit to be tested 120 can be established;
3—Response of filters 123 either in the digital or analogue domain can be mapped;
4—Degradation of circuit performance over product lifetime can be established;
5—Vibration self-calibration may be possible;
6—Enables end to end test verification from a remote sensor device to server application.

The output circuitry 130 may comprise an analog to digital converter (ADC) 131 coupled to a digital signal processor (DSP) 132. The ADC 131 receives the sine wave from the circuit to be tested 120 and converts it to the digital domain before passing it to DSP 132. The same DSP 111, 132 may be used for the input circuitry 110 and the output circuitry 130, or DSP 111 may be distinct from DSP 132. Although an ADC and DSP are used in the example shown in FIG. 1, it should be appreciated that any output circuitry 130 configured to receive a wave with AC characteristics may be used.

The DSP 132 may be configured to perform signal amplitude or frequency assessments on the source signal received at the output circuitry 130 (i.e. the output signal). The DSP 132 may analyze the amplitude and/or frequency of the output signal against the predicted out-put signal based on the known components of the circuit to be tested 120. For example, the gain of the circuit or the proper functioning of the pass filters may be checked.

Additionally, or alternatively, the DSP 132 may be configured to convert the output signal from the time domain to the frequency domain, for example by performing a Fast Fourier Transform (FFT). The output signal can then be analyzed in the frequency domain. This is further illustrated in FIG. 3.

The signal generated by the DSP 111 is passed by the DAC 112 of the input circuitry 110 which propagates through the circuit to be tested 120 of multiple stages 121,122 and is sampled by the ADC 131 driven by the digital signal processor 132 of the output circuitry 130.

Figure 2:
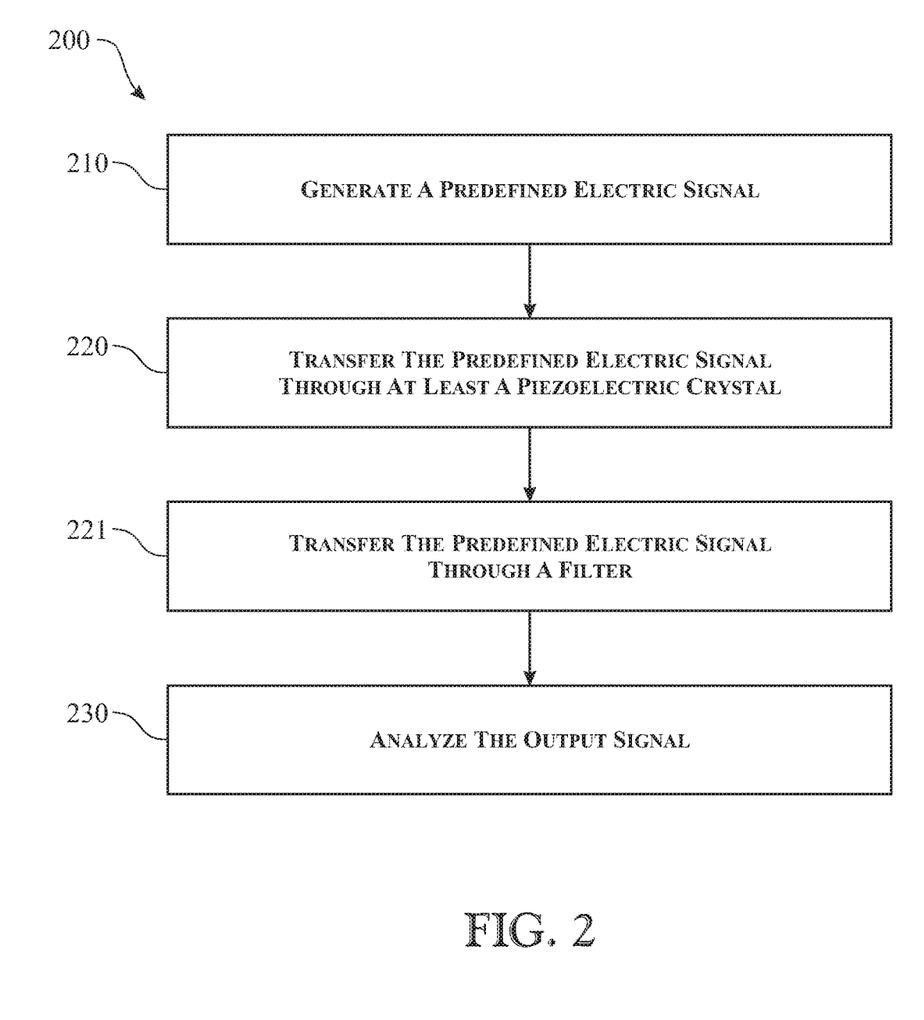
FIG. 2 shows a flow chart of a method for self-testing a circuit.

FIG. 2 shows a flowchart of a method 200 for self-testing a circuit. The method 200 includes generating a predefined electric signal 210; transferring the predefined electric signal through at least a piezoelectric crystal of a circuit to be tested to generate an output signal 220; and analyzing the output signal 230.

Generating the predefined electric signal 210 may comprise generating a sinusoidal signal. As explained in connection with FIG. 1, any wave with AC characteristics may be used. A sinusoidal wave is preferred, although a combined source signal containing multiple characteristics may also be used (such as a complex wave). The sinusoidal wave may comprise a frequency greater than 0 Hz but less than the resonant frequency of the piezoelectric crystal. The sinusoidal wave may be a voltage signal. For example, the predefined electric signal may be a sinusoidal voltage signal of 10 Hz with a fixed amplitude.

The predefined electric signal (e.g. the sine wave) is then passed through the piezoelectric crystal of the circuit to be tested. The signal may then pass through the piezoelectric crystal to any other stages of the circuit to be tested. Transferring the predefined electric signal 220 may further comprise transferring the predefined electric signal through the piezoelectric crystal and at least one of a low-pass, bandpass, and high-pass filter circuit of the circuit to be tested to generate an output signal 221. The sinusoidal signal may pass through one or more other circuit stages as well. These other circuit stages may comprise passive or active circuit components. Once the predefined electric signal has passed through the circuit to be tested, a resulting output signal is generated which can then be analyzed.

Analyzing the output signal 230 may comprise performing signal amplitude or frequency assessments on the output signal. As explained in connection with FIG. 1, the amplitude and/or frequency of the output signal may be compared against the predicted output signal based on the known components of the circuit to be tested.

Figure 3:
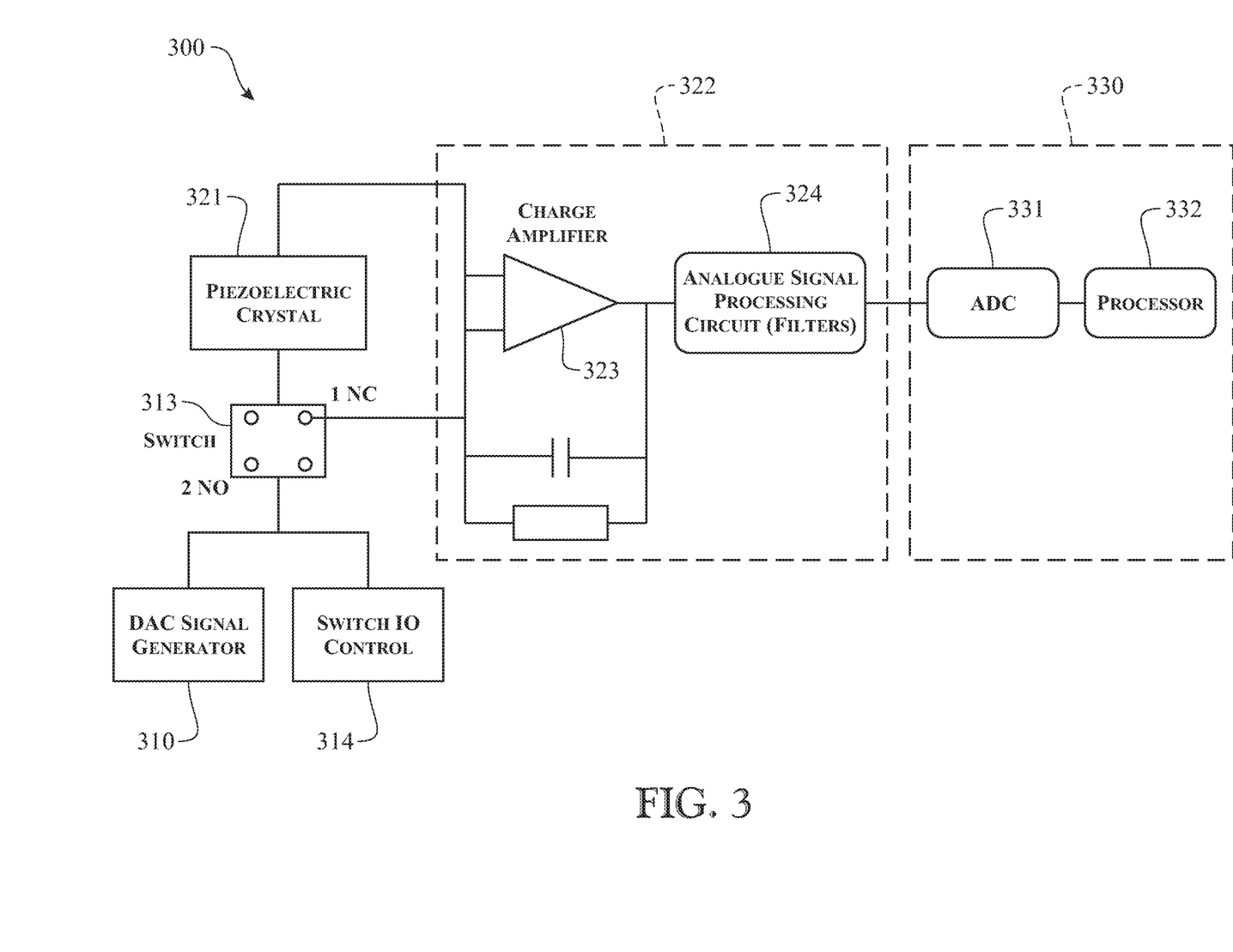
FIG. 3 shows an embodiment of a self-test circuit.

FIG. 3 shows an embodiment 300 of the self-test circuit 100 configured to employ the method 200. A test signal input circuit, shown by DAC Signal Generator 310 (corresponding to DSP 111 and DAC 112 of the input circuitry 110) is configured to generate a predefined electric signal, e.g. in the form of a sine wave of predefined frequency. The sine wave can be injected into the circuit to be tested by the DAC Signal Generator 310 through a switch 313 controlled by Switch IO Control 314. The switch 313 can be used for switching between self-test mode (NO) and normal operation (NC) of the circuit. Normally, the switch remains in normal operation. When a self-test is desired, the switch selects self-test mode in order to allow the input circuitry to generate and transfer the predefined electrical signal into the piezoelectric crystal. The switch remains in the NO position until the provided electrical signal has passed through the circuit to be tested and the output signal has been generated. The role of the switch 313 is to either direct the signal from the piezoelectric crystal to a charge amplifier input 323 (i.e. normal operation) or to direct the signal from the DAC (as part of signal generator 310) through the crystal (i.e. self-test mode). It should be appreciated that the use of switch 313 prevents the Signal Generator 310 from being permanently coupled to the piezoelectric crystal 321, thus reducing potential electrical noise. By using the switch 313, the signal generator 310 can be isolated from the crystal in normal operation.

The predefined electric signal is transferred through the switch 313 and through the piezoelectric crystal 321 and on to other circuit stages 322. It should be appreciated that the electrical signal is transferred through the piezoelectric crystal itself (in a manner similar to a capacitor) rather than a pulse hitting the crystal to "ring" it (which is more akin to applying a mechanical force to the bearing to which the crystal is attached, as per traditional methods). The other circuit stages 322 downstream to the piezoelectric crystal 321 may comprise amplifiers, filters, capacitors, resistors, or other analog and/or digital circuit components. In the illustrated example, the sine wave is transferred through an amplifier stage 323. The output signal of the amplifier stage 323 can be passed through other circuit stages 322, such as a further bandpass filter 324. Finally, the output signal reaches the testing circuitry 330, where the analog signal is converted by ADC 331 and passed to a processor 332 so that amplitude or frequency assessments may be performed and the output signal analyzed. The result of those assessments is shown in FIG. 4.

Figure 4:
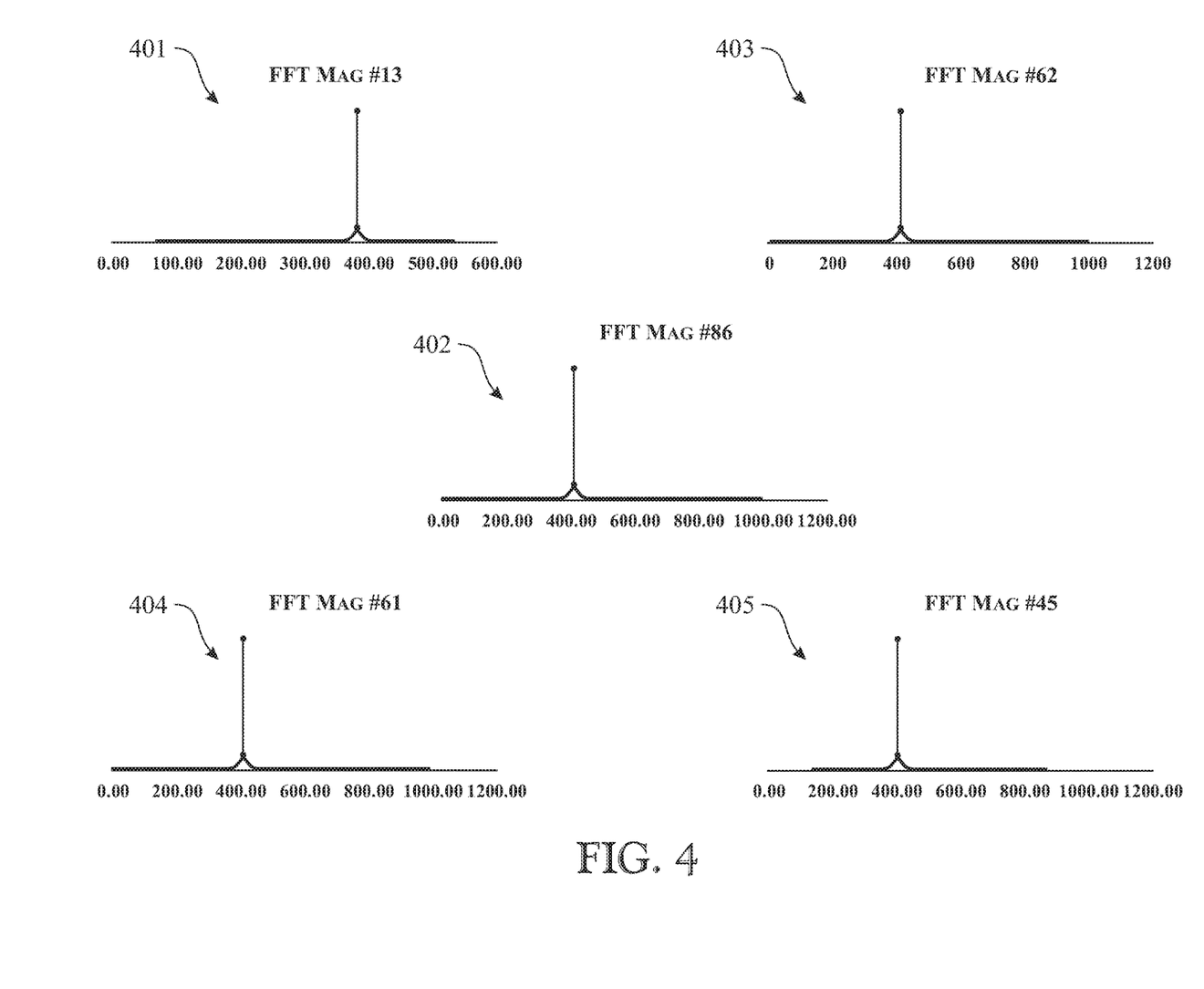
FIG. 4 shows graphs of data obtained from five different test rigs.

FIG. 4 shows graphs 401,402,403,404,405 of amplitude assessments on the data obtained from five different test rigs setup according to FIG. 3. The graphs show the self-test signal digitized and converted from the time to the frequency domain. In particular, an FFT (Fast Fourier Transform) was performed on each signal. Each plot shows a different test setup for an identical test signal. In the test setups shown in FIG. 3, the resulting signal must fall with-in a predefined threshold which can be chosen based on desired tolerances.

If the resulting signal lies within these thresholds, the circuit to be tested is properly functioning. The threshold values may be chosen based on known circuit components, predicted output results, and/or desired tolerances.

Advantages include the ability to check the health of a remote sensor device. Additionally the health can be trended over time. The integrity of sections of the design can be verified through the signal captured at the analogue to digital converter. Self-calibration may also be possible.

The present disclosure facilitates the verification of a signal chain of multiple elements. This ensures that component and functional integrity is established and assists in establishing the location of faults through a signal path. More specifically, it relates to checking the integrity of a signal path from a piezoelectric crystal through multiple stages.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for per-forming one or more of the above methods, when the computer program is executed on a computer or processor. Steps, operations or processes of various above-described methods may be performed by programmed computers or processors. Examples may also cover pro-gram storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical pur-poses to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit con-figured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical rea-sons. Therefore, the disclosure of multiple acts or functions will not limit these to a particular order unless such acts or functions are not interchangeable for technical reasons. Further-more, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A self-test circuit comprising:
   input circuitry;
   testing circuitry; and
   a circuit to be tested coupled between the input circuitry and the testing circuitry and comprising a piezoelectric crystal;
   wherein the input circuitry is configured to generate a predefined sinusoidal electric signal and to pass the electric signal through the piezoelectric crystal of the circuit to be tested, and
   wherein the testing circuitry is configured to analyze the electric signal after the electric signal has passed through the piezoelectric crystal.

2. The self-test circuit of claim 1, wherein the circuit to be tested further comprises at least one of a low-pass, bandpass, and a high-pass filter circuit.

3. The self-test circuit of claim 1, wherein the testing circuitry is configured to perform signal amplitude or frequency assessments on the electric signal.

4. The self-test circuit of claim 1, wherein the testing circuitry comprises a signal processor configured to convert the electric signal from time domain to frequency domain and to analyze the electric signal in the frequency domain.

5. The self-test circuit of claim 1, wherein the input circuitry is configured to generate the at least one electric signal with a frequency greater than 0 Hz and less than a resonant frequency of the piezoelectric crystal.

6. The self-test circuit of claim 1, wherein the input circuitry comprises a digital signal processor configured to generate a predefined digital signal and to convert the digital signal to the analog domain to generate the predefined electric signal.

7. The self-test circuit of claim 1, further comprising a switch configured to select between a normal operation and a test mode, wherein, when in the test mode, the switch connects the input circuitry to the circuit to be tested and wherein the switch is configured to select the test mode at least until the electric signal reaches the testing circuitry.

8. A method for self-testing a circuit comprising:
   generating a predefined sinusoidal electric signal;
   passing the predefined electric signal through a piezoelectric crystal of a circuit to be tested; and
   analyzing the electric signal after the electric signal has passed through the piezoelectric crystal.

9. The method of claim 8, further comprising filtering the electric signal before analyzing the electric signal.

10. The method of claim 8, wherein analyzing the electric signal comprises performing signal amplitude or frequency assessments on the electric signal.

11. A self-test circuit comprising:
   input circuitry;
   testing circuitry; and
   a circuit to be tested coupled between the input circuitry and the testing circuitry, the circuit to be tested comprising a piezoelectric crystal and a filter;
   wherein the input circuitry is configured to generate a predefined sinusoidal electric signal and to pass the sinusoidal electric signal through the piezoelectric crystal and the filter, and
   wherein the testing circuitry is configured to analyze the sinusoidal electric signal after the sinusoidal electric signal has passed through the piezoelectric crystal and the filter.

\* \* \* \* \*